United States Patent [19]
Nishio et al.

[11] Patent Number: 5,567,661
[45] Date of Patent: Oct. 22, 1996

[54] FORMATION OF PLANARIZED INSULATING FILM BY PLASMA-ENHANCED CVD OF ORGANIC SILICON COMPOUND

[75] Inventors: Hidetoshi Nishio; Takako Furuse; Yumiko Hamada; Hiroyuki Uesugi, all of Kawasaki, Japan

[73] Assignee: Fujitsu Limited, Japan

[21] Appl. No.: 253,778

[22] Filed: Jun. 3, 1994

[30] Foreign Application Priority Data

Aug. 26, 1993 [JP] Japan .................................. 5-211200

[51] Int. Cl.⁶ .................................................. H01L 21/02
[52] U.S. Cl. ........................ 437/228; 437/235; 437/238
[58] Field of Search ................................ 437/235, 238, 437/228

[56] References Cited

U.S. PATENT DOCUMENTS

| | | | |
|---|---|---|---|
| 4,726,963 | 2/1988 | Ishihara et al. | 427/39 |
| 4,737,415 | 4/1988 | Ichijo et al. | 428/447 |
| 4,762,730 | 8/1988 | Enke et al. | 1427/40 |
| 4,778,721 | 10/1988 | Slieners et al. | 428/336 |
| 4,822,697 | 4/1989 | Haluska et al. | 428/698 |
| 4,863,755 | 9/1989 | Hess et al. | 427/39 |
| 4,911,992 | 3/1990 | Haluska et al. | 428/698 |
| 4,927,704 | 5/1990 | Reed et al. | 428/222 |
| 5,000,113 | 3/1991 | Wang et al. | 118/723 |
| 5,041,303 | 8/1991 | Wertheimer et al. | 427/39 |
| 5,051,308 | 9/1991 | Reed et al. | 428/412 |
| 5,156,882 | 10/1992 | Rzad et al. | 427/489 |
| 5,298,587 | 3/1994 | Hu et al. | 528/10 |
| 5,318,928 | 6/1994 | Gegenwart et al. | 437/235 |
| 5,320,875 | 7/1994 | Hu et al. | 427/493 |

FOREIGN PATENT DOCUMENTS

| | | | |
|---|---|---|---|
| 4-80365 | 3/1992 | Japan | C23C 16/40 |
| 4-246175 | 9/1992 | Japan | C23C 16/40 |

OTHER PUBLICATIONS

'Si Processing for the VLSI Era', vol. 2, Stanley Wolf (1990).
Ray et al 'Low–Temp. Dep. of Dielectric Films by Microwave Plasma Enhanced Decomposition FHMDS', J. of Electronic Materials, vol. 20, (1991) p. 9907.
'Properties of Low–Pres. CVD Dielectric Films From HMPS', J. Vac. Sci Tech., A7(3), May/Jun. 1989, p. 1446.
'High Rate Dep. of SiO₂ Membrane by Excimer Laser . . . Low Temp.', Jpn J. Appl. Phys., vol. 32 (1993) pp. 3109–3112, No. 63 part 1.

*Primary Examiner*—Robert Kunemund
*Assistant Examiner*—Matthew Whipple
*Attorney, Agent, or Firm*—Nikaido, Marmelstein, Murray & Oram LLP

[57] ABSTRACT

A method of manufacturing a semiconductor device including the steps of: preparing a semiconductor substrate having convexities and concavities on the surface thereof; and generating plasma by using organic silicon having silazane bonding and oxidant and depositing a planarized insulating film on the semiconductor substrate by plasma chemical vapor deposition. The organic silicon may be HMCTSZ and the substrate temperature during deposition is preferably not higher than about 100° C., e.g. 50° C.

20 Claims, 6 Drawing Sheets

FORMATION OF PLANARIZED INSULATING FILM BY PLASMA-ENHANCED CVD OF ORGANIC SILICON COMPOUND

BACKGROUND OF THE INVENTION a) Field of the Invention

The present invention relates to manufacturing insulating films, and more particularly to a method and apparatus for manufacturing semiconductor devices having planarized insulating films.

b) Description of the Related Art

Requests for high integration and high speed operation of semiconductor IC devices are increasing more and more. In order to highly integrate semiconductor elements and operate them at a high speed, it is necessary to layout a number of semiconductor elements in a small chip area and in some cases interconnect elements by multi-layer wirings by increasing the number of wiring layers. It is desired to narrow the width of each wiring layer. The height of a wiring with a narrow width becomes greater than that of a wiring with a larger width if both the wires should have the same resistance.

The surface of a chip having such multi-layer wirings is extraordinarily irregular, so that not only the step coverage of a wiring layer formed on the chip surface but also the precision of photolithography is degraded. Therefore, planarization technique plays a more important roll in planarizing the surface of an underlying layer such as an interlayer insulating film on which a multi-layer wiring is formed.

Reflow of glasses having a softening point lowered by additive impurities, such as phosphorous silicate glass (PSG), boron silicate glass (BSG), and boron phosphorous silicate glass (BPSG), is known as one of such insulating film planarization techniques. Glass reflow technique requires a relatively high temperature so that its use is restricted and cannot be applied to semiconductor chips having a wiring with low resistance to heat such as Al or a highly precise impurity profile.

Lower temperature planarization technique has been desired. Silicon oxide film deposition technique by reacting tetraethylorthosilicate (TEOS) with ozone, can be used at a relatively low temperature and has a self-planarization function of reducing steps on the surface of an underlying layer. Although a region between convexities having a relatively narrow span can be efficiently filled with an ozone-TEOS oxide film, the planarization performance is lowered at a region between convexities having a wider span.

A silicon oxide film made from spin-on-glass (SOG) can be formed by spin-coating liquid phase silicon compound at a room temperature and annealing it at an elevated temperature. This method has a good planarization performance because of use of liquid phase silicon compound. However, this oxide film is likely to contain adsorbed or residual components such as water because the substrate is exposed in the air. It is necessary for the reduction of these unnecessary components to raise an annealing temperature. A spin coating process uses a spin coater and has a poor integrity with a dry process.

The insulating property of an oxide film formed by using such a self-planarization function is generally inferior to that of a silicon oxide film formed by general chemical vapor deposition (CVD). It is however difficult for general CVD to reduce steps on the surface of a silicon oxide film because this film is deposited in conformity with the shape of an underlying layer.

An approach has been proposed therefore in which a CVD oxide film is once formed conformably on or conformal to the surface of a substrate having steps of a wiring pattern and another oxide film having a self-planarization function such as SOG is formed on the CVD oxide film. In this specification, an insulating film without or scarcely having a self-planarization function, such as a general CVD insulating film deposited on the surface and side walls of a substrate, is called a "conformable" insulating film.

Another approach has also been proposed in which an oxide film having a self-planarization function and formed on a CVD oxide film is at least partially removed, for example, by etch-back, to thereby reduce the quantity of the oxide film having a poor film quality. In a further approach, a CVD oxide film is deposited on the surface of the etched-back oxide film to seal the oxide film having a poor film quality such as an SOG oxide film.

In the case of the method of planarizing the surface of a substrate with steps by using an ozone-TEOS oxide film, it is difficult to achieve sufficient planarization if spans between convexities formed, for example, by wirings, are wide.

If the method of planarizing the surface of a substrate by using an SOG oxide film is used to obtain a finished oxide film having a good film quality, it is preferable to coat, anneal, etch back an SOG film and form a CVD oxide film on the SOG film. However, a combination of these processes elongates a turn-around time (TAT) and increases a manufacturing cost.

Furthermore, a spin coater as well as a CVD system is required, and they show a low integrity so that it is difficult to combine them into a single unit. It is difficult to avoid out-gas of an SOG oxide film which gas hinders forming electrical contacts and selective growth at the later processes.

SUMMARY OF THE INVENTION

It is another object of the present invention to provide a method of manufacturing a semiconductor device having an insulating film, capable of planarizing the surface of the film at steps having either a wide span or a narrow span by using only dry processes.

It is another object of the present invention to provide a semiconductor device having an insulating film, capable of planarizing the surface of the film at steps having either a wide span or a narrow span by using only dry processes.

According to one aspect of the present invention, there is provided a method of manufacturing a semiconductor device having an insulating film including the steps of: preparing a semiconductor substrate having convexities and concavities on the surface thereof; and generating plasma by using organic silicon having silazane bonding and oxidant and depositing a planarized insulating film on said semiconductor substrate having convexities and concavities by plasma chemical vapor deposition.

According to another aspect of the present invention, there is provided a method of depositing an insulating film including the step of generating plasma by reacting a mixed gas containing oxygen atoms and an atom group represented by $(SiR_3)2NR'$, $(SiR_2NR')_3$, or $(SiR_2NR')_4$ where where R and R' are the same or different and where each of R and R' is $C_nH_{2n+1}$ (n=0, 1, 2, 3, ...), and using plasma chemical vapor deposition.

It has been found experimentally that an insulating film formed by generating plasma by using organic silicon having silazane bonding Si—N and oxidant can planarize the surface of the film at steps having either a wide span or a narrow span.

DETAILED DESCRIPTION OF THE PREFERRED EMBODIMENTS

A method of forming an insulating film according to a fundamental embodiment of the present invention will be described with reference to FIGS. 1A and 1B.

Figure 1A:
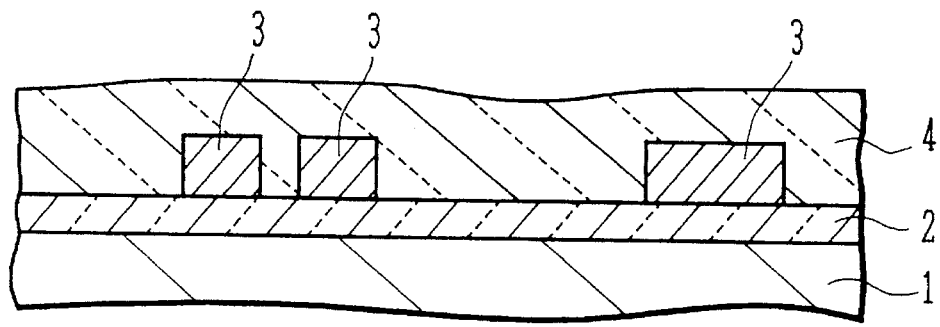
FIGS. 1A and 1B are a cross sectional view and a block diagram explaining a method of manufacturing a semiconductor device according to a fundamental embodiment of the present invention.

As shown in FIG. 1A, a BPSG film 2 is deposited by CVD to a thickness of about 0.5 to 1 μm on the surface of a silicon substrate 1 formed with active regions such as diffusion regions. An aluminum alloy layer is deposited by sputtering to about 1 μm on the BPSG film 2. A resist film is coated on the aluminum alloy film, and exposed and developed to form a resist pattern. By using the resist pattern as an etching mask, the aluminum alloy film is patterned to form an aluminum alloy wiring 3. The surface of the silicon substrate 1 with the aluminum alloy wiring 3 has steps or convexities and concavities.

Figure 1B:
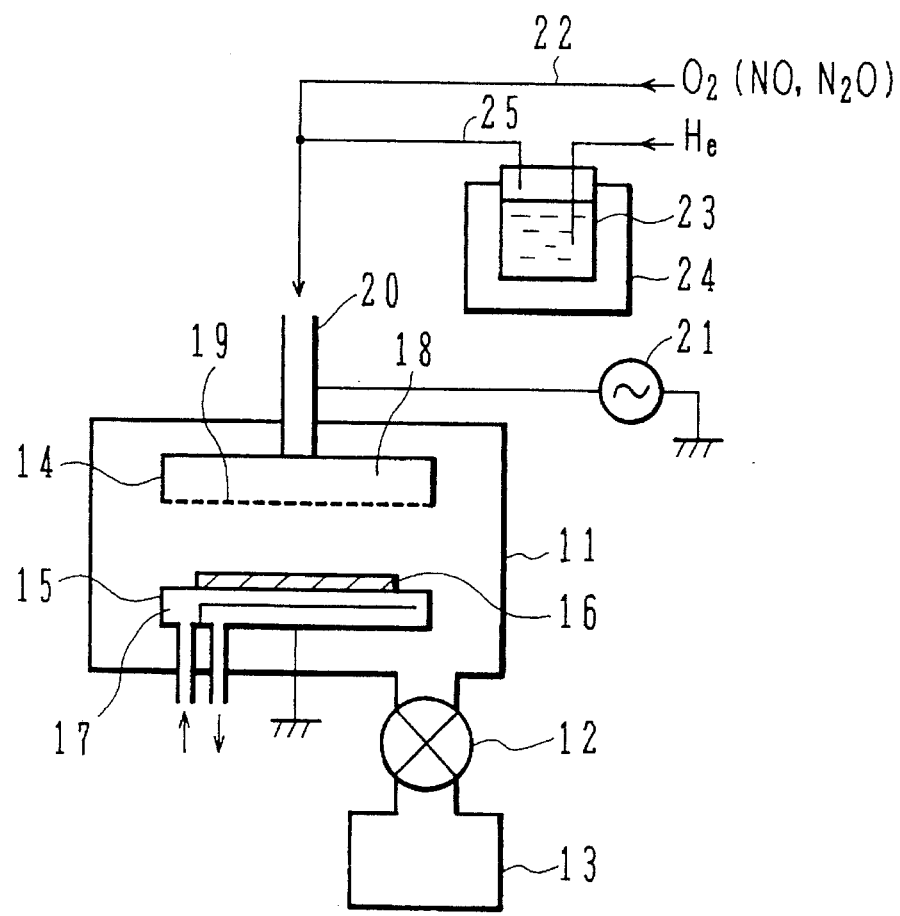

This silicon substrate is placed in a diode parallel plate plasma CVD system such as shown in FIG. 1B, and a silicon based insulating film is formed to planarize the surface above convexities and concavities.

Referring to FIG. 1B, a hermetic chamber 11 has parallel plate electrodes 14 and 15 and communicates via a valve 12 with an evacuation device 13. The upper parallel plate electrode 14 has a gas passage formed therein, and has a gas outlet plate 19 formed at the bottom thereof and having a number of openings. By introducing reaction gas from an upper gas inlet port 20, the gas can be supplied from the gas outlet plate 19 toward the lower parallel plate electrode 15.

The lower parallel plate electrode 15 has a temperature controller and can set a desired temperature by, for example, forming a gas passage 17 therein and flowing temperature-controlled gas such as Ar. A silicon substrate 16 is placed on the lower parallel plate electrode 15. The lower parallel plate electrode 15 is grounded and the upper parallel plate electrode 14 is connected to an RF power source 21.

Gas passages 22 and 25 are connected to the gas inlet port 20 of the upper parallel plate electrode 14. Oxidant such as $O_2$, NO, and $N_2O$ is supplied to the gas passage 22. He gas bubbled in organic silicon accommodated in a vessel 23 is supplied to the gas passage 25.

Figure 2A:
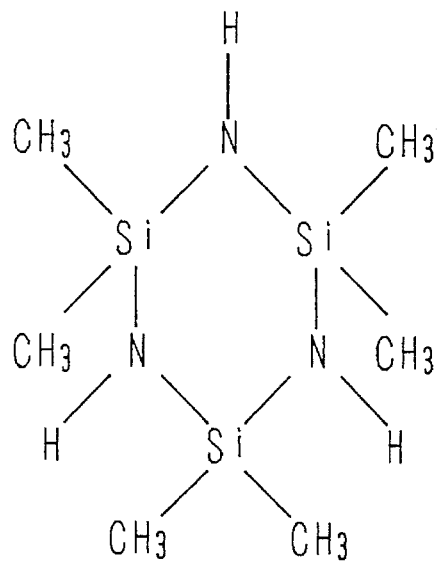
FIGS. 2A to 2D are schematic diagrams showing the structure of organic silicon to be used by embodiments of this invention.

As organic silicon, hexamethylcyclotrisilazane (HMCTSZ) $Si_3C_6H_{21}N_3$ represented by the chemical bonding structure shown in FIG. 2A is used which is one of $(SiR_2NR)_3$ where R is an optional atom group represented by $C_nH_{2n+1}$ (n is zero or a positive integer, i.e. n=0, 1, 2, 3, ...). The temperature of the vessel 23 is set to, for example, 35° C. HMCTSZ is of a liquid phase at the room temperature and has a vapor pressure suitable for bubbling.

The temperature of the silicon substrate 16 is maintained to be about 100° C. or less, for example, about 50° C. The viscosity of a deposited oxidized HMCTSZ film tends to rise as a temperature rises. A low substrate temperature is therefore preferable to increase a flowability of the deposited film and enhance a planarization function.

A flow rate of $O_2$ to He is set to about 1:10 to 20. $O_2$ and He-diluted-HMCTSZ are introduced into the chamber 11. An RF power is supplied from the RF power source 21 to the parallel plate electrodes 14 and 15 at a frequency of 13.56 MHz and at a power density of about 0.4 W/cm². Plasma is generated from $O_2$ and He-diluted-HMCTSZ by the supplied RF power, and an organic silicon oxide film is deposited on the silicon substrate 16, for example, to a thickness of about 0.7 μm. It is not always easy to define a thickness of this organic silicon oxide film because the thickness can change widely depending on the shape of the underlie. The value of thickness will be interpreted as a measure of thickness on a high flat surface. The thickness of the film becomes large in concave portions.

An HMCTSZ organic silicon oxide film has a superior self-planarization function an can planarize the surface above convexities having a span up to about 100 μm. In the above example, if the span between convexities of the wiring pattern 3 is about 100 μm or narrower, the surface above steps or convexities and concavities can be effectively planarized.

It is conceivable that when HMCTSZ is oxidized, the silazane bonding is dissociated and O is bonded in place of NH to form polydimethylsiloxane. It is known that polydimethylsiloxane has a viscosity (flowability) changing with its polymerization degree. It is conceivable that as such organic silicon having silazane bonding, organic silicon represented by $(SiR_2NR)_3$ having the structure shown in FIG. 2C, organic silicon, such as hexamethyldisilazane, represented by $(SiR_3)_2NR$ having the structure shown in FIG. 2B, or organic silicon, such as octamethylcyclotetrasilazane, represented by $(SiR_3NR)_4$ having the structure shown in FIG. 2D may be used.

In FIGS. 2A to 2D, R represents a phenyl radical, a vinyl radical or $C_nH_{2n+1}$ (n=0, 1, 2, 3, ...). R is preferably a methyl, a phenyl, or a hydrogen from the viewpoint of endurance to heat or high temperature.

Other organic silicon materials having silazane bonding may be used. It is preferable to use a cyclo or ring-shaped silazane so as to realize a desired polymerization degree.

In the above example, $O_2$ is used as oxidant. Instead of $O_2$, it is conceivable that other oxidants may be used such as nitric oxide and nitrous oxide.

Ammonium ($NH_3$), $NF_3$, or the like may be added to the oxidant. These additives change a reaction condition. Planarization like the above example is achieved by controlling the reaction condition using $NF_3$ additive. It is possible to planarize the surface above steps having either a wide span or a narrower span by generating plasma of a mixed gas of organic silicon having silazane bonding and oxidant and forming a silicon oxide insulating film. With this planarization, it is possible to reliably prevent insufficient step coverage of a multi-layer wiring.

Figure 3A:
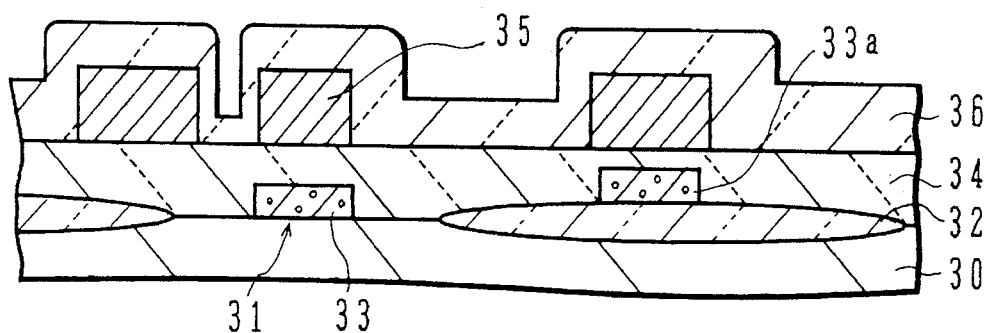
FIGS. 3A to 3D are schematic cross sectional diagrams explaining a method of manufacturing a semiconductor device according to a first embodiment of the present invention.

FIGS. 3A to 3D are cross sectional views explaining a method of manufacturing a semiconductor device according to another embodiment of this invention. As shown in FIG. 3A, a field oxide film 32 is formed by LOCOS (local oxidation of silicon), surrounding an active region 31 of a silicon substrate. After the field oxide film 32 is formed, a nitride film and an oxide film thereunder, used as the oxidation mask, are removed and a thin gate oxide film is formed by thermal oxidation or the like.

Thereafter, a polycrystalline silicon layer is deposited on the surface of the silicon substrate and patterned by photolithography to form a gate electrode 33 and a gate wiring 33a. Ion implantation is done to form source/drain regions. After these elements are formed, a boron phosphorous silicate glass (BPSG) film 34 is formed to a thickness of about 500 nm, covering the gate electrode 33 and gate wiring 33a. This BPSG film 34 is formed, for example, by CVD at a temperature of about 380° C. and at an atmospheric pressure by using $SiH_4$, $O_2$, $B_2H_6$, and $PH_3$ as source gasses together with dilution gas $N_2$. The BPSG film 34 is reflown to planarize it. The BPSG film 34 functions as an interlayer insulating film between the gate wiring 33a and an overlying wiring.

An Al alloy containing Si of 1% is sputtered on the BPSG film 34 to form an Al alloy layer having a thickness of about 700 nm. This Al alloy layer is patterned by photolithography to form an Al wiring 35 which is hereinafter called an underlying wiring layer. Convexities having a thickness of about 700 nm appear on the surface of the silicon substrate after the Al wiring 35 is formed.

A silicon oxide film 36 is deposited to a thickness of about 500 nm covering the underlying wiring layer, by CVD at a temperature of about 300° C. using $SiH_4$ and $N_2O$ as source gasses. This silicon oxide film 36 is formed in conformity with the shape of the underlying wiring layer. The thickness of the silicon oxide film 36 formed at side walls is less than the thickness of the film 36 formed on flat surfaces. If a concavity between Al wirings 35 has an aspect ratio of 1 or smaller, the silicon oxide films formed at the side walls of the concavity do not contact each other, so that a good silicon oxide film without any cavity can be formed.

Figure 3B:
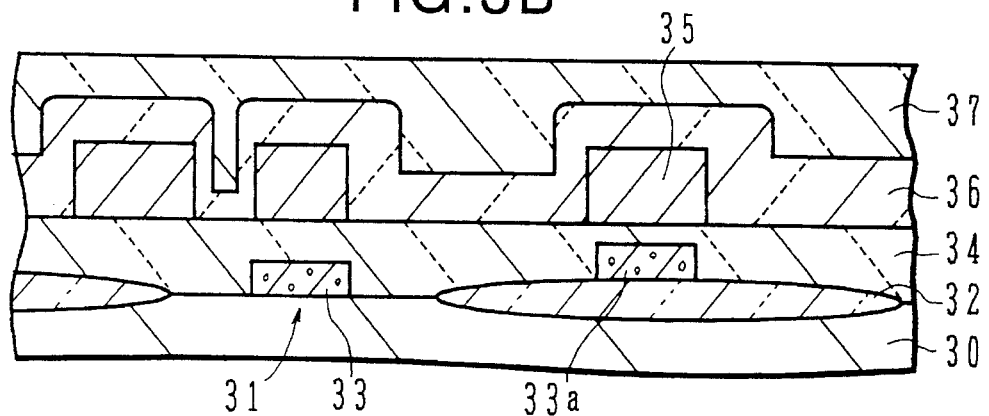

As shown in FIG. 3B, an insulating film 37 made of organic silicon oxide is formed to a thickness of about 500 nm by plasma CVD using hexamethylcyclotrisilazane (HMCTSZ) and $O_2$. The thickness of this film 37 is not required to have a definite value over the whole region because it changes with the shape of the underlying wiring layer. It is sufficient if this film fills concavities and cover the surface of the underlying wiring layer.

This plasma CVD is performed under the conditions of a substrate temperature of about 100° C. or lower, e.g., at about 50° C., an RF frequency of 13.56 MHz, and RF power of about 0.4 $W/cm^2$, He bubbling of HMCTSZ, and an $O_2$/He flow ratio of about 0.1.

The HMCTSZ oxide film 37 formed under the above-described conditions has a flat surface as shown in FIG. 3B. If the span between underlying convexities is up to about 100 μm, the HMCTSZ oxide film 37 has a flat surface.

In the case of SOG planarization, it has been inevitable that the SOG surface has a step height of about 100 μm if the span between underlying convexities is about 100 nm and the convexities have a step height of about 1 μm. A plasma oxide film using HMCTSZ has therefore an excellent self-planarization function.

The performance of an organic silicon oxide film formed by HMCTSZ depends on the characteristics of source materials and a film forming method. The performance of an organic silicon oxide film formed by HMCTSZ becomes different in some cases, for example, from that of a silicon oxide film formed by CVD using silane based material. It is therefore preferable in some cases to reduce the quantity of an HMCTSZ oxide film or to cover this film by a CVD oxide film.

Figure 3C:
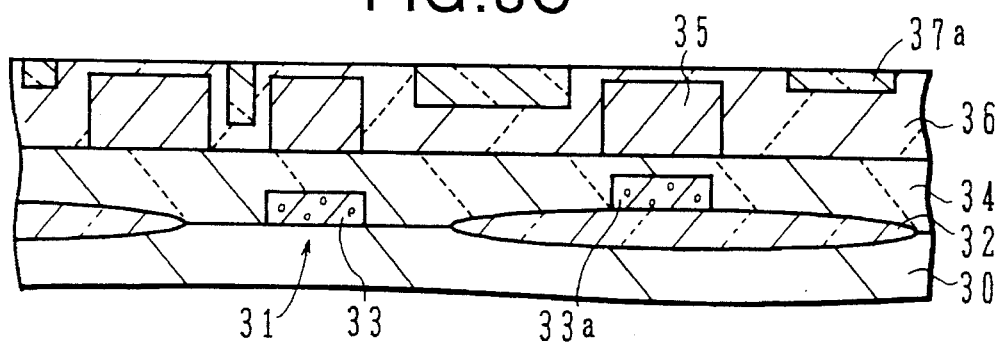

As shown in FIG. 3C, the silicon substrate is placed in an reactive ion etching (RIE) system and subjected to etch back a surface by about 700 nm. As a result, the insulating film 37 above the underlying convexities is removed, and the silicon oxide film 36 on the underlying convexities is etched by about 200 nm, leaving the insulating film 37a only on the underlying concavities. Because the surface of the silicon substrate has been planarized almost completely at the step of FIG. 3B, the surface of the silicon substrate etched back has almost a flat surface.

The conditions of etch-back are an etchant gas flow ratio $CF_4/CHF_3$ of 1, an RF power of about 350 W, and a pressure of about 150 mTorr. Under these conditions, etching is isotropic having an etching rate ratio of about 1 between the CVD oxide film 36 and HMCTSZ oxide film 37.

Figure 3D:
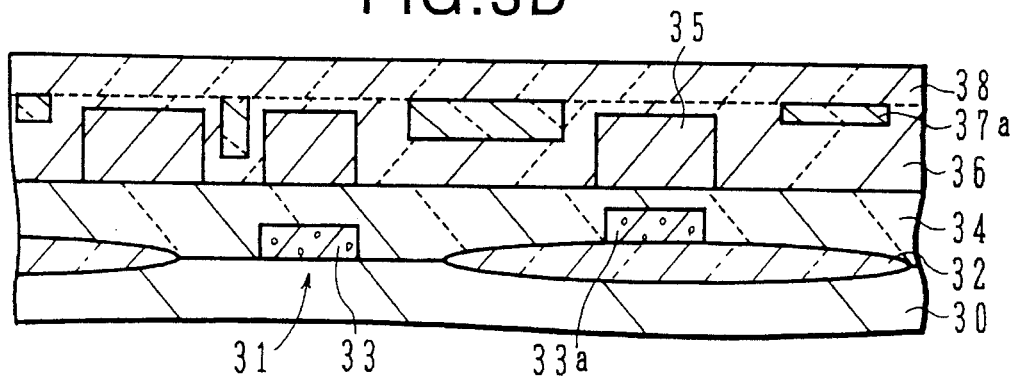

As shown in FIG. 3D, a silicon oxide film 38 is deposited on the surface of the etched-back silicon substrate by the same process of forming the CVD oxide film 36 shown in FIG. 3A.

In the above manner, it is possible to planarize the surface above concavities and convexities of a CVD oxide film by an organic silicon oxide film with silazane bonding and to form a flat cap layer covering the planarized surface.

A viscosity of an insulating film of HMCTSZ becomes high as the substrate temperature at the deposition process rises. For example, a viscosity becomes too high (flowability becomes too low) at a substrate temperature of about 150° C. or higher so that it is difficult to achieve good planarization. Therefore, a planarized insulating film is deposited at a substrate temperature of about 150° C. or lower, preferably about 100° C. or lower. The substrate temperature is also preferably above the melting point of the silazane compound being used.

Figure 4:
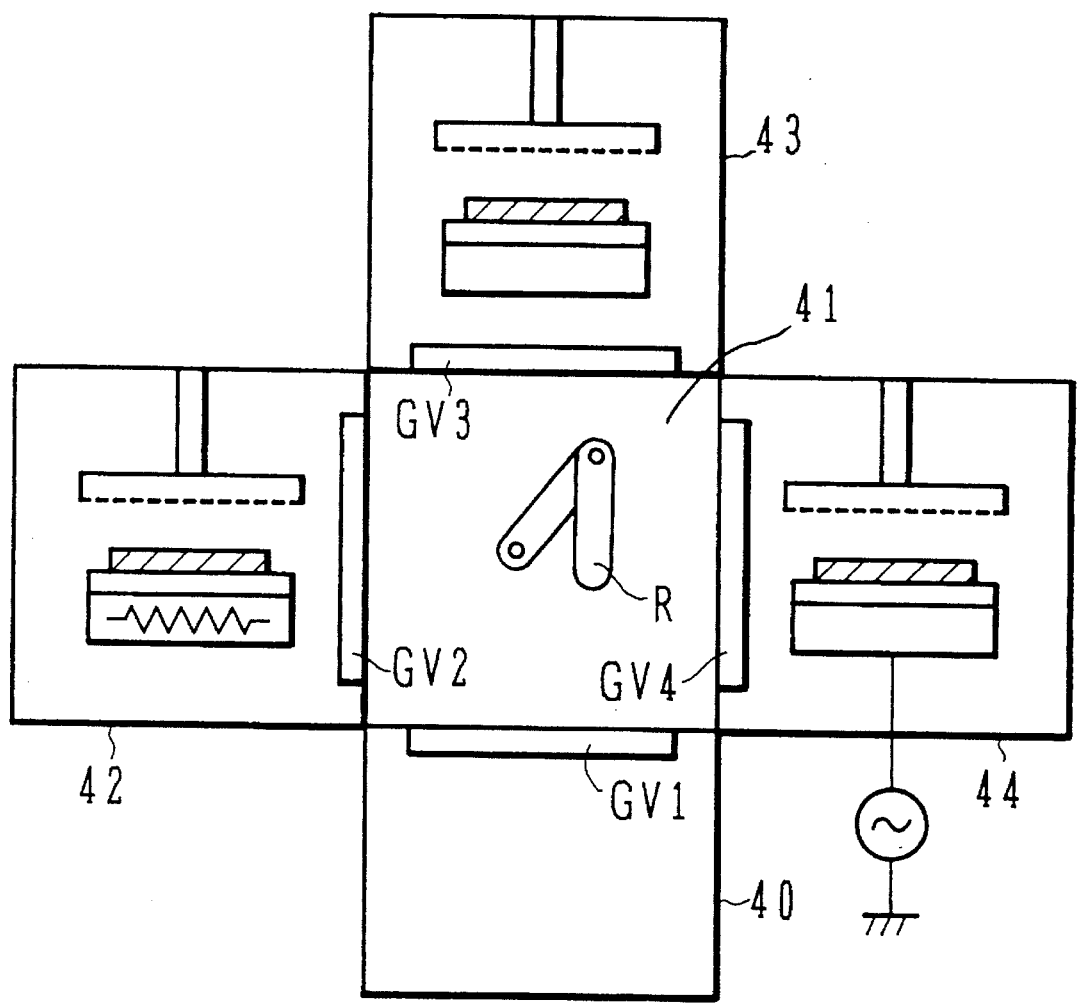
FIG. 4 is a schematic block diagram showing a system of manufacturing a semiconductor device according to a second embodiment of the present invention.

FIG. 4 is a schematic diagram of an apparatus suitable for practicing the manufacturing method explained with reference to FIGS. 3A to 3D. A load-lock chamber 41 having a wafer transport mechanism R is coupled via gate valves GV2 to GV4 to three processing chambers 42, 43, and 44. A preparation chamber 40 is also coupled via a gate valve GV1 to the load-lock chamber 41. Each chamber can be evacuated independently.

A silicon wafer is transported from the preparation chamber 40 in which wafer cassettes are housed, to the load-lock chamber 41 from which the silicon wafer can be transported to any one of the processing chambers 42 to 44. The processing chamber 42 is for example a plasma CVD processing chamber which can deposit a plasma CVD film on a semiconductor wafer placed on a susceptor heated to a predetermined temperature. Although not shown in FIG. 4, an RF power source and gas sources are provided like those shown in FIG. 1B.

The processing chamber 43 is a chamber for forming an insulating film by using organic silicon having silazane bonding and oxidant. The structure of this chamber 33 is like that shown in FIG. 1B. The processing chamber 44 is an etch-back chamber having parallel plate electrodes for RIE. In FIG. 4, an RF power source is connected to the lower electrode. The RF power source may be connected to the upper electrode or to both the electrodes. Each processing chamber is provided with gas sources like those shown in FIG. 1B.

The system shown in FIG. 4 can sequentially perform the processes starting from depositing a silicon oxide film shown in FIG. 3A to depositing a silicon oxide film shown in FIG. 3D, without exposing a wafer in the air.

Next, another embodiment will be described also with reference to FIGS. 3A to 3D. The processes up to forming an Al underlying wiring 35 are the same as the above-described embodiment. After the underlying wiring 35 is formed, a silicon nitride oxide film 36 is formed by plasma CVD by using $SiH_4$ and $N_2O$ as source gasses with reduced amount of oxidant $N_2O$. The shortage of oxidant results in incorporation of nitrogen. $NH_3$ may be added if necessary. The nitride oxide film 36 having a reflective index of about 1.75 is deposited to a thickness of about 500 nm.

Thereafter, the process shown in FIG. 3B is performed to deposit an HMCTSZ insulating film 37 to a thickness of about 500 nm. Thereafter, the process shown in FIG. 3C is performed to etch back the silicon substrate by about 700 nm. The etching conditions are etchant gasses of $CF_4+O_2$, a $CF_4/O_2$ flow ratio of 10, an RF power of 1 kW, and a pressure of 1.0 Torr.

Under these conditions, the etching rate ratio is about 1 between the CVD nitride oxide film 36 and insulating film 37. This etching is isotropic and is performed while maintaining a flat surface because of the planarized insulating film 37. After this etch-back, a CVD oxide film 38 covering the surface of the insulating film 37 may be formed by the process explained with reference to FIG. 3D.

In the embodiments explained with reference to FIGS. 3A to 3D, in addition to HMCTSZ, other organic silicon materials having silazane bonding may be used. For example, organic silicon having the structure shown in FIG. 2B may be used. An example of this organic silicon is hexamethyldisilazane where R is $CH_3$. Organic silicon having the structure shown in FIG. 2C may be used. If R is $CH_3$, the organic silicon is HMCTSZ used in the embodiments.

Figure 2C:
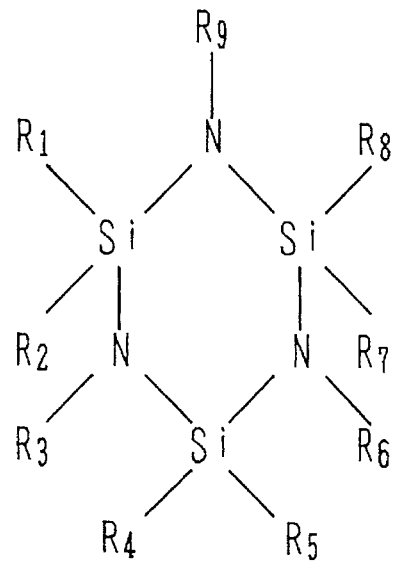
Figure 2B:
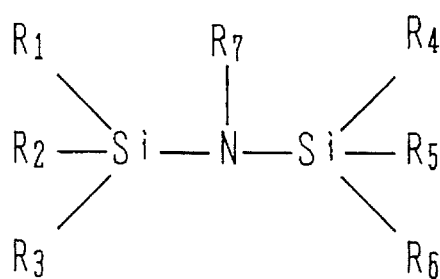
Figure 2D:
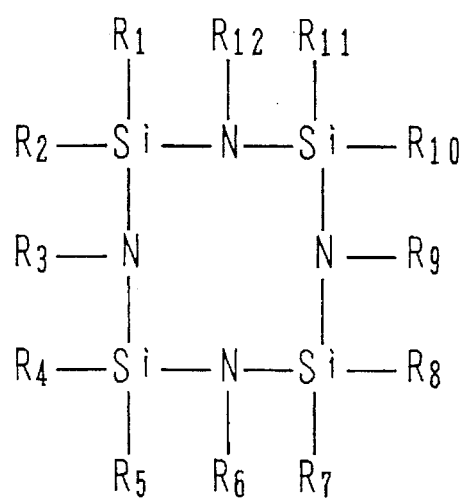

Organic silicon having the structure shown in FIG. 2D may be used. An example of this organic silicon is octamethylcyclotetrasilazane. It is more preferable as described earlier to use silazane compound having a ring structure.

In place of $O_2$, oxidant may be $N_2O$, NO, or the like. $NF_3$ or $NH_3$ may be added to oxidant. In the above embodiments, all interlayer insulating films can be formed by CVD processes. Accordingly, a good integrity between processes can be attained and the embodiment method is suitable for manufacturing products such as ASIC which have a number of different types to be manufactured by a small quantity.

Figure 5A:
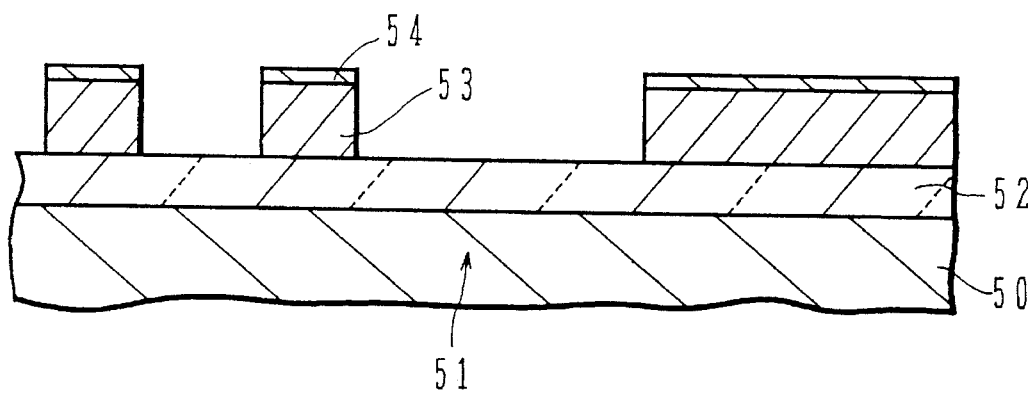
FIGS. 5A to 5C are cross sectional views explaining a method of manufacturing a semiconductor device according to a third embodiment of the present invention.

A method of manufacturing a semiconductor device according to another embodiment of the present invention will be described with reference to FIGS. 5A to 5C. As shown in FIG. 5A, elements such as transistors and resistors are formed on the surface region 51 of a silicon substrate 50. As an interlayer insulating film between the elements and an overlying wiring layer, a BPSG film 52 having a thickness of about 500 nm is formed by the process as described earlier.

An Al alloy layer containing Si of 1% is sputtered on the BPSG film 52 to a thickness of about 700 nm, and a TiN layer is sputtered on the Al alloy layer to a thickness of about 100 nm. A resist layer is coated on the TiN layer and patterned to form an etching mask. Lower wiring layer made of an Al alloy layer 53 and a TiN layer 54 is formed by etching using the resist mask.

Figure 5B:
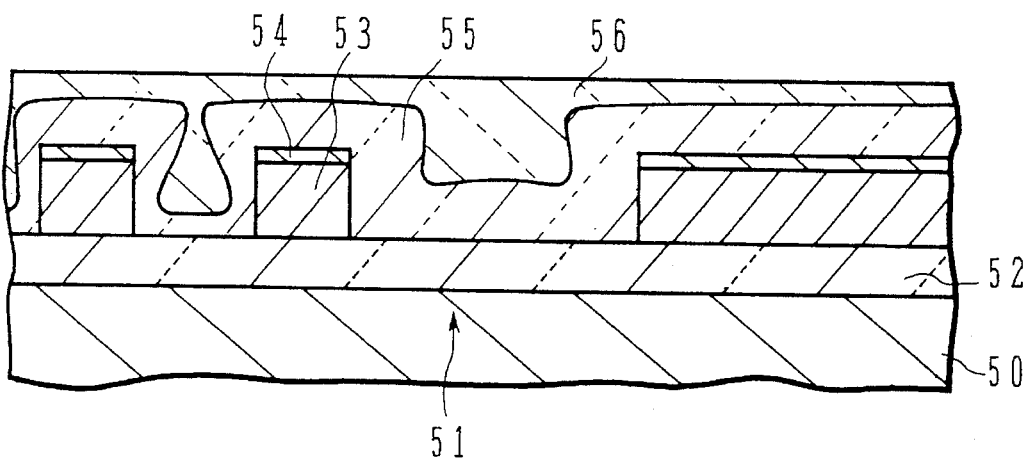

Next, as shown in FIG. 5B, a silicon oxide film 55 is deposited to a thickness of about 500 nm by plasma CVD using silane based material. CVD using TEOS and oxygen may also be used.

Next, an insulating film 56 having a thickness of about 200 nm at convexities of the underlying wiring layer is formed in parallel plate plasma CVD system, by using hexamethylcyclotrisilazane (HMCTSZ) as source gas and $O_2$ as oxidant. The deposition conditions are a substrate temperature of 100° C. or lower, e.g., 50° C., an RF frequency of 13.56 MHz, an RF power of 0.4 W/cm$^2$, He bubbling of HMCTSZ, and an $O_2$/He flow ratio of 0.1. The surface is planarized by this HMCTSZ oxide film.

Figure 5C:
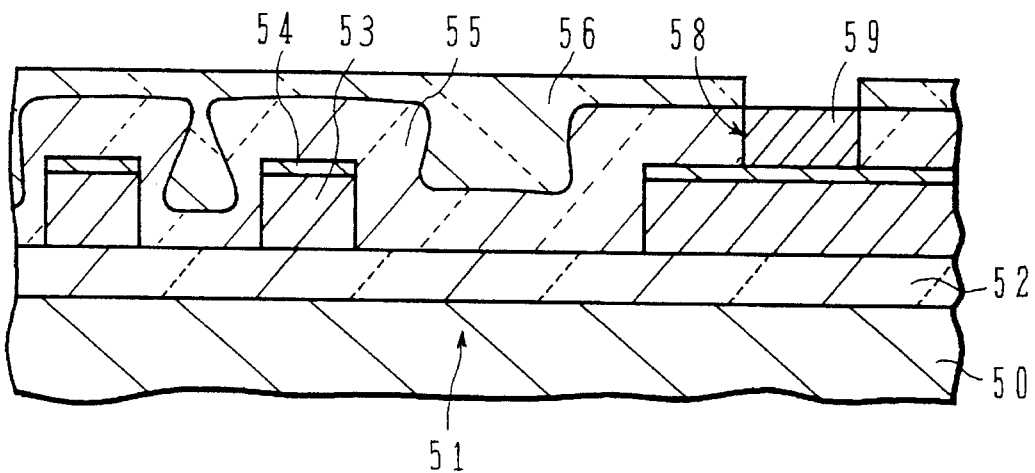

As shown in FIG. 5C, a contact hole 58 is formed through the insulating film 56 and silicon oxide film 55 by photolithography using a resist mask. A W layer 59 is selectively grown to a thickness of about 500 nm on the surface of the TiN layer 54 exposed in the contact hole 58.

The selective growth conditions are a substrate temperature of about 300° C., a growth pressure of 0.1 Torr, source gasses of $WF_6$, $SiH_4$, and $H_2$, and a flow ratio $WF_6/SiH_4/H_2$ of 5/2/80. W is grown only on the metal layer surface exposed in the contact hole and not grown on the insulating film. Selective growth of W may be substituted by selective growth of other metals such as Al or Cu.

If instead of the insulating film using HMCTSZ, inorganic SOG is coated to a thickness of about 80 nm, cured at a temperature of 450° C. for about 30 minutes under an $N_2$ atmosphere, a contact hole is formed, and a selective W growth is performed, then an abnormal W growth having a number of W particles is formed on the insulating film to be presumedly caused by out-gas. It can be understood therefore as compared to an SOG oxide film, the insulating film using HMCTSZ has less out-gas.

In the embodiment shown in FIGS. 5A to 5C, the insulating film made from organic silicon having silazane bonding is formed after the CVD oxide film is formed. The insulating film made from organic silicon having silazane bonding may be formed directly on the wiring layer.

Figure 6:
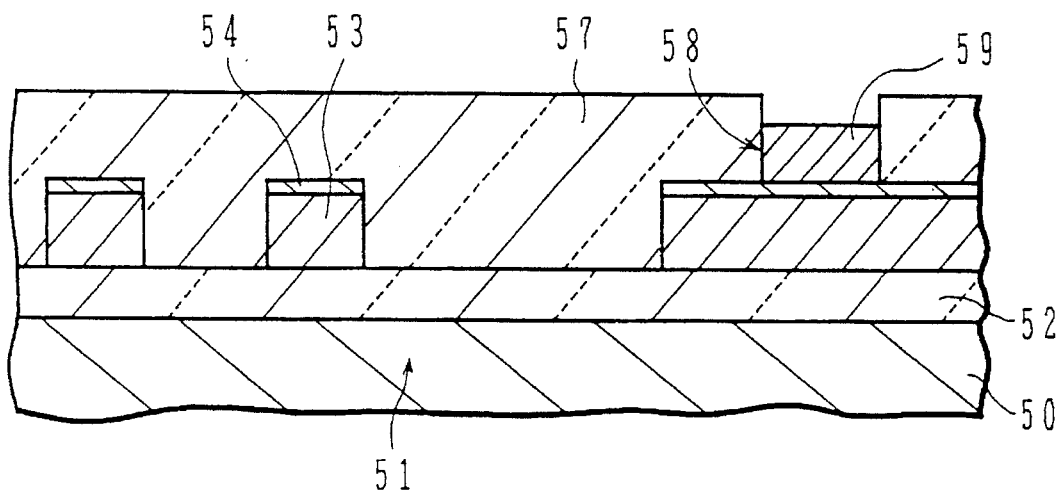
FIG. 6 is a cross sectional view explaining a method of manufacturing a semiconductor device according to a fourth embodiment of the present invention.

FIG. 6 is a cross sectional view explaining a method of manufacturing a semiconductor device according to another embodiment of the invention. The processes of forming a BPSG film 52 on a silicon substrate 50, and forming lower wiring layers 53 and 54 and patterning them, are similar to the embodiment shown in FIGS. 5A to 5C.

After the lower wiring layers 53 and 54 are formed, an insulating film 57 using HMCTSZ is directly formed on the substrate surface to a thickness of about 800 nm by the process similar to the embodiment shown in FIGS. 5A to 5C. The surface of this insulating film becomes flat. Thereafter, similar to the embodiment shown in FIGS. 5A to 5C, a contact hole 58 is formed and W is selectively grown in the contact hole to form a W plug 59. Selective growth of a plug is not limited to W. Selective growth of metal such as W, Cu, or Al can be employed.

Also in the embodiments shown in FIGS. 5A to 5C and in FIG. 6, other organic silicon materials having silazane bonding and other oxidants may also be used. In particular, cyclosilazane compound as shown in FIGS. 2A, 2C and 2D with R formed of phenyl, methyl which have good thermal resistance or hydrogen radical are preferable.

The present invention has been described in connection with the preferred embodiments. The invention is not limited only to the above embodiments. Although hexamethylcyclotrisilazane (HMCTSZ) has been mainly used as the source material of an insulating film, other organic silicon materials having silazane bonding may be used as the source material of silicon. For example, organic silicon materials having the structures shown in FIGS. 2A to 2D may be used. It is preferable to use silazane compound having a ring or cyclosilazane structure.

$O_2$, $N_2O$, and NO may be used as oxidant, and other oxidants may also be used. $NF_3$ or $NH_3$ may be added to the oxidant. It is apparent to those skilled in the art that various modifications, improvements, combinations and the like can be made without departing from the scope of the appended claims.

We claim:

1. A method of manufacturing a semiconductor device having an insulating film comprising the steps of:

preparing a semiconductor substrate having one of convexities and concavities which create a step height on a surface thereof; and generating plasma by using organic silicon having tri- or more silazane bonding and oxidant and depositing a planarized insulating film on said semiconductor substrate by plasma chemical vapor deposition at a substrate temperature of about 100° C. or lower in order to significantly reduce the step height.

2. A method according to claim 1, wherein said organic silicon has a cyclosilazane bonding.

3. A method according to claim 1, wherein said organic silicon is $(SiR_2NR')_3$, or $(SiR_2NR')_4$ where each of R and R' is at least one of a phenyl, a vinyl, and $C_nH_{2n+1}$ (n=0, or positive integer).

4. A method according to claim 1, wherein said oxidant is at least one of $O_2$, $N_2O$, and NO.

5. A method according to claim 1, wherein in said deposition step, plasma is generated by adding $NH_3$ or $NF_3$.

6. A method according to claim 1, wherein said step of preparing said semiconductor substrate further includes a step of forming a wiring pattern on the substrate.

7. A method according to claim 6, wherein said step of preparing said semiconductor substrate further includes a step of forming a conformable insulating film on the wiring pattern by CVD.

8. A method according to claim 1, further comprising a step of etching back said planarized insulating film at least above said one of convexities and concavities.

9. A method according to claim 6, further comprising the steps of:

forming a contact hole in said planarized insulating film and exposing said wiring pattern; and selectively growing metal on said wiring pattern exposed in said contact hole.

10. A method according to claim 3, wherein said step of preparing said semiconductor substrate further includes a step of forming a conformable insulating film on the semiconductor substrate by CVD.

11. A method according to claim 8, wherein said step of preparing said semiconductor substrate further includes a step of forming a conformable insulating film on the semiconductor substrate by CVD.

12. A method according to claim 9, wherein said step of preparing said semiconductor substrate further includes a step of forming a conformable insulating film on the wiring pattern by CVD.

13. A method of depositing an insulating film comprising the steps of:

generating plasma by reacting a mixed gas containing oxygen atoms and an organic atom group represented by $(SiR_2NR')_3$, or $(SiR_2NR')_4$ where each of R and R' is $C_nH_{2n+1}$ (n=0, 1, 2, 3, . . . ), and depositing a planarized insulating film on a semiconductor substrate at a temperature of 100° C. or lower using plasma chemical vapor deposition, said planarized insulating film significantly reducing a step height created by one of convexities and concavities on a surface of the semiconductor substrate.

14. A method according to claim 13, wherein said mixed gas is added with ammonia.

15. A method of depositing an insulating film comprising the step of:

generating plasma by reacting a mixed gas containing oxygen atoms and an organic atom group represented by $(SiR_2NR')_3$, or $(SiR_2NR')_4$ where each of R and R' is methyl, phenyl or H, and depositing a planarized insulating film on a semiconductor substrate at a temperature of 100° C. or lower using plasma chemical vapor deposition, said planarized insulating film significantly reducing a step height created by one of convexities and concavities on a surface of the semiconductor substrate.

16. A method according to claim 2, wherein said organic silicon is $(SiR_2NR')_3$, or $(SiR_2NR')_4$ where R and R' are phenyl, vinyl or $C_nH_{2n+1}$ (n=0 or a positive integer).

17. A method according to claim 2, wherein said oxidant is at least one of $O_2$, $N_2O$, and NO.

18. A method according to claim 2, wherein said step of generating plasma includes adding $NH_3$ or $NF_3$.

19. A method according to claim 13, wherein said atom group has a cyclosilazane bonding.

20. A method according to claim 15, wherein said atom group has a cyclosilazane bonding.

* * * * *